Figure 1:
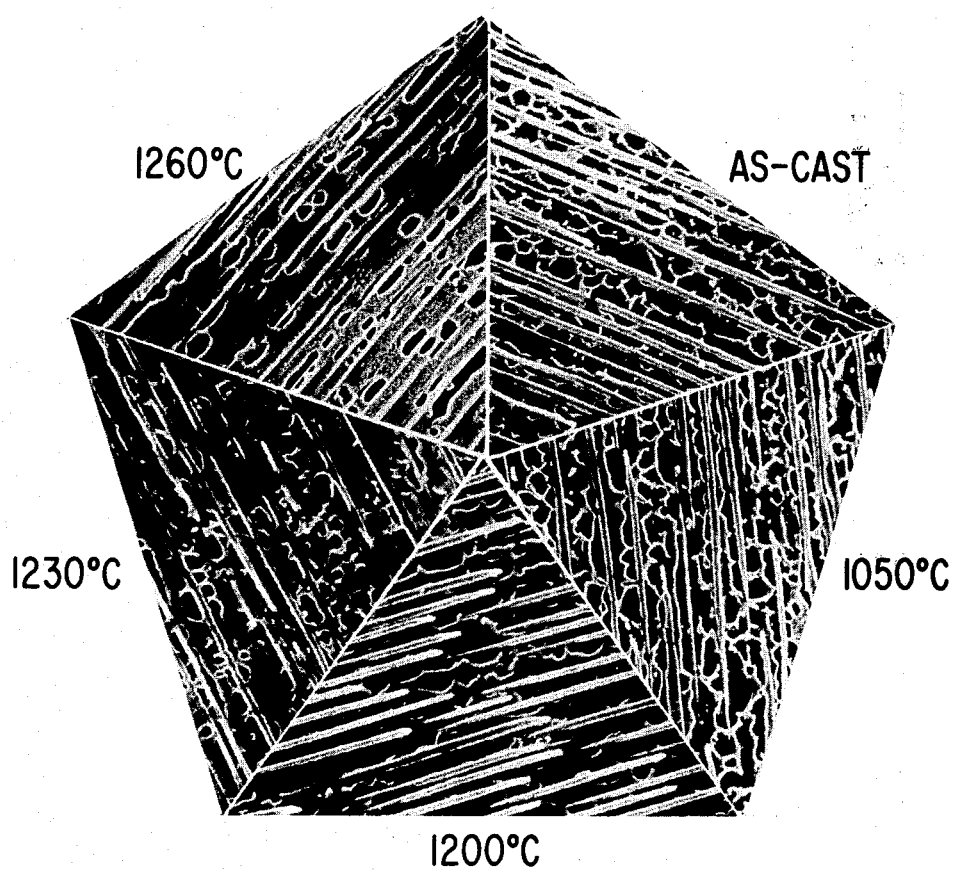

United States Patent [19]

Henry

[11] 4,161,412

[45] Jul. 17, 1979

[54] METHOD OF HEAT TREATING $\gamma/\gamma'$-$\alpha$ EUTECTIC NICKEL-BASE SUPERALLOY BODY

[75] Inventor: Michael F. Henry, Schenectady, N.Y.

[73] Assignee: General Electric Company, Schenectady, N.Y.

[21] Appl. No.: 854,975

[22] Filed: Nov. 25, 1977

[51] Int. Cl.² .............................................. C22F 1/10
[52] U.S. Cl. ...................................... 148/3; 148/20.3; 148/32.5; 148/162
[58] Field of Search .................. 148/162, 32.5, 3, 20.3

[56] References Cited

U.S. PATENT DOCUMENTS 4,012,241  3/1977  Lemkey ............................... 148/32.5

Primary Examiner—R. Dean
Attorney, Agent, or Firm—F. Wesley Turner; Joseph T. Cohen; Charles T. Watts

[57] ABSTRACT

A method of improving the mechanical properties of a $\gamma/\gamma'$-$\alpha$ eutectic nickel-base superalloy body containing a $\gamma$-phase, a $\gamma'$-phase, and an aligned molybdenum fiber $\alpha$-phase which comprises the steps (a) heating the body to a temperature at which at least a portion of the $\gamma'$-phase will transform to a $\gamma$-phase, (b) maintaining the heated body at said temperature to allow transformation of at least a portion of said $\gamma'$-phase to a $\gamma$-phase, and (c) cooling the transformed body to a temperature at which at least a portion of the $\gamma$-phase precipitates as a modified $\gamma'$-phase.

15 Claims, 3 Drawing Figures

METHOD OF HEAT TREATING γ/γ'-α EUTECTIC NICKEL-BASE SUPERALLOY BODY

CROSS REFERENCE TO RELATED APPLICATIONS

This invention is related to subject matter disclosed to my copending U.S. patent application Ser. No. 691,758 filed June 1, 1976, entitled DIRECTIONALLY SOLIDIFIED EUTECTIC γ/γ'-α NICKEL-BASE SUPERALLOYS. This application is assigned to the same assignee as the assignee of this invention. All of the disclosure of the above application is incorporated herein in its entirety be reference.

BACKGROUND OF THE INVENTION

1. Field of the Invention

This invention relates to a method of improving the mechanical properties of a γ/γ'-α eutectic nickel-base superalloy body containing a γ-phase, a γ'-phase, and an aligned molybdenum fiber α-phase which comprises the steps (a) heating the body to a temperature at which at least a portion of the γ'-phase will transform to a γ-phase, (b) maintaining the heated body at said temperature to allow transformation of at least a portion of said γ'-phase to a γ-phase, and (c) cooling the transformed body to a temperature at which at least a portion of the γ-phase precipitates as a modified γ'-phase.

As is traditional in the nickel-base superalloy field, the nomenclature γ refers to a solid solution of a face centered cubic crystal structure and the nomenclature γ' refers to an ordered $LI_2$ phase based on $Ni_3Al$ where other elements may substitute for some of the aluminum.

2. Description of the Prior Art

Thompson and Lemkey (Report M110544-2, United Aircraft Corporation, April 1973) and Ashbrook ("AGARD Conference Proceedings No. 156", AGARD/NATO, April 1974, pp. 93-115) report a γ'-α nickel-base eutectic consisting of $Ni_3Al$, designated γ', matrix and molybdenum fibers, designated α. Thompson and Lemkey report that the alloy exhibits a melting point of 1,306° C., a fiber volume fraction of 26%, a density of 8.18 g/cm$^3$, a room temperature tensile strength of 1,120 MN/m$^2$, an elongation to failure of 21%, and a modulus of elasticity of 138 GN/m$^2$. Ashbrook reports that the Thompson and Lemkey data are based on a eutectic γ'-α containing, on a weight percent basis (w/o), 65 Ni - 8.0 Al - 27.0 Mo.

Unexpectedly, as reported in the above-referenced copending U.S. patent application Ser. No. 691,758 filed June 1, 1976, I found that Thompson and Lemkey's composition is a γ-α eutectic and is not a γ'-α eutectic. I have found that the Thompson and Lemkey alloy freezes as a γ-α eutectic and on subsequent cooling undergoes a solid state phase transformation in the matrix whereby the γ is converted to substantially 100% γ'. This finding of fact is based on the examination of photographs of the microstructures of a series of alloy specimens annealed near the melting point of the Thompson and Lemkey alloy which were subsequently rapidly quenched to preserve the microstructure representing equilibrium at the annealing temperature. Further, as a result of the work carried out during the evaluation of the unheat-treated alloys claimed in Ser. No. 691,758, I found unexpectedly that optimum stress rupture life values are associated with directionally solidified alloys which contain, on a weight percent basis, variable amounts of aluminum, e.g. wherein the aluminum content is less than 7.0, preferably less than 6.5 and more preferably less than 6.3 w/o Al for alloys containing three chemical elements, i.e. Ni, Al and Mo. Further I found that the optimum range for improved stress rupture properties for unheat-treated three elements Ni, Al and Mo alloys corresponds with a 5.7 to 6.3 w/o aluminum range.

Unexpectedly, I have now found that substantial improvement in the mechanical properties, e.g. stress rupture life, of γ/γ'-α eutectic nickel-base superalloys can be obtained by heating the alloy to a temperature at which at least a portion of the γ'-phase transforms into γ-phase with subsequent cooling of the resulting melt and solid solution whereby at least a portion of the resolutioned γ-phase precipitates as a modified γ'-phase, i.e., a γ'-phase of different grain size and/or spacing than the grain size and spacing associated with the unheated alloy. Heat treatment of directionally solidified γ/γ'-α eutectic nickel-base superalloys substantially improves the mechanical properties of any γ/γ'-α alloy, including those of 3-element Ni-Al-Mo alloys having less than 7.0 w/o aluminum as well as the prior art 65 w/o Ni-8.0 w/o Al-27 w/o Mo - γ-α eutectic of Thompson and Lemkey subject to the proviso that the resulting alloy has a γ/γ'-α alloy morphology. For a 3-element Ni-Al-Mo alloy any aluminum content can be employed which permits the formation of a γ/γ'-α eutectic, e.g. 2–12 w/o aluminum, 12–40 w/o molybdenum, the balance being nickel. Further, and additionally, heat treatment related improvement in the mechanical properties of γ/γ'-α eutectic alloys also occurs when the basic Ni-Al-Mo alloy types are further modified by the addition thereto of other alloy elements, such as Cr, Co, Ta, Ti, B, W, Re, Nb, Zr, Hf, Y and the rare earth elements, B or carbon, including combinations thereof.

DESCRIPTION OF THE INVENTION

This invention embodies a method of improving the mechanical properties of a γ/γ'-α eutectic nickel-base superalloy body containing a γ-phase, a γ'-phase, and an aligned molybdenum fiber α-phase which comprises the steps (a) heating the body to a temperature at which at least a portion of the γ'-phase will transform to a γ-phase, (b) maintaining the resulting heated body at said temperature to allow transformation of at least a portion of the γ'-phase to a γ-phase, and (c) cooling resulting transformed body to a temperature at which at least a portion of the γ-phase precipitates as a modified γ'-phase.

The method of my invention comprises at least a single stage heat treatment, i.e., a heating followed by cooling of an γ/γ'-α eutectic nickel-base superalloy containing, on a weight percent basis, 2–12 Al, 12–40 Mo, and optionally 0–15 Co, 0–6 Ti, 0–8 V, 0–12 Cr, 0–15 Ta, 0–10 W, 0–8 Re, 0–12 Nb, 0–2 Zr, 0–2 Hf, 0–1 Y and the rare earth elements, 0.0–0.2 B, or 0.0–0.2 C, the balance being Ni. In general, the heat treatment develops alloy morphologies comprising γ' particles which consist essentially of regularly shaped particles having a grain size less than 5.0 microns per side, preferably less than 1.0 micron per side, and even more preferably less than 0.1 micron per side when looking at a transverse or longitudinal section of a directionally solidified alloy. Broadly the heat treated γ/γ'-α eutectic alloys of my invention comprise any γ/γ'-α or γ'-α alloy wherein the heat treated reprecipitated γ' particles constitute less than 100 volume percent of the resulting alloy. In a preferred embodiment, the volume percent (v/o) of reprecipitated γ' is within the range of from about 15 to 90 volume percent, and the grain size particles have a dimension of from 0.005 to about 0.1 microns per side.

The first and second stages of the heat treatment method of my invention are designed to put at least a portion of a solid stage γ' precipitate — of either a γ/γ'-α eutectic alloy or the γ'-α alloy of Thompson and Lemkey, i.e., 65 w/o Ni-8 w/o Al-27 w/o Mo — into solution at a temperature above about 1,100° C. and below about 1,300° C. The third stage is designed to rapidly cool the alloy whereby some of the γ phase precipitates in a solid state transformation to form γ' particles having either or both a different grain size or volume percent than that which was associated with the originally directionally solidified γ/γ'-α or γ'-α eutectic nickel-base superalloy.

Not limiting my invention to any theory, I believe that my heat treating method provides for reprecipitation by solid stage transformation of γ to γ' substantially throughout the alloy microstructure by the nucleation of new γ' grains under conditions of restricted growth, i.e. rapid cooling, in the presence of a secondary γ-phase. The reprecipitation of γ' under controlled conditions, i.e. controlled grain growth provides reproducable microstructures which promote maximum alloy strength at elevated temperatures. Initial heating causes partial dissolution — depending upon time and temperature factors — of γ' phase into a γ-phase of the alloy matrix areas. Subsequent rapid cooling establishes a uniformity of the γ to γ' precipitated phase throughout the matrix.

Heating of the superalloy converting γ' to γ' may be carried out at any temperature range which results in either partial or complete transformation of γ' to γ and at any temperature range which with subsequent cooling permits reprecipitation of γ'. As indicated hereinbefore, the degree of transformation of γ' to γ and subsequently to γ', regarding the beneficial improvement in the mechanical properties of the superalloys of this invention is dependent not only upon the quantity of γ' converted to γ and reprecipitated as γ', but upon the grain size of the precipitated γ'-phase. The volume fraction of γ' and particulate precipitate form which optimizes the mechanical properties following the teachings of my invention can be determined for γ/γ'-α eutectic nickel-base superalloys by those of ordinary skill in the art through routine experimentation.

In general, the first and second stages of the heat treating method can be carried out at any temperature within the range of from about 1,100° C. to 1,300° C. for a time period of at least one second followed by a third stage cooling temperature of less than 1,100° C.

In a presently preferred embodiment the heat treating temperature is 1,200° C. to 1,290° C., the time period is 5 minutes to 2 hours, and the cooling temperature is lower than 600° C. Heating of the superalloy body to the heat treatment range can be carried out at any rate.

The cooling stage is preferably carried out in an inert atmosphere, such as argon, nitrogen or helium. Cooling can be carried out by quenching the superalloy body at any rate, presently preferably at a rate of at least about 10° C. per second to a temperature below about 600° C. In general, the cooling rate will more preferably be somewhat greater than the cooling rate stated above, e.g., 10° C. per second to a temperature below about 600° C., such as 200° C. per second. Cooling rates, which prevent precipitation of the intermetallic γ'-phase should be avoided. While it is believed that cooling rates substantially greater than 400° C./second may have such effect, my invention contemplates the use of cooling rates of up to 800° C./second and higher, and such cooling rates are within the scope of the claims to my new method, provided that no substantial suppression of the precipitation of the desired intermetallic γ'-phase results.

Optionally and as a part of my invention, any number of additional or types of heat treatment or heat treatment stages can be employed to further enhance the mechanical properties of γ/γ'-α eutectic nickel-base superalloys. Illustratively, after a first, second and third stage heat treatment, the eutectic alloys can be reheated to a temperature lower than the solidus temperature of γ', i.e., a temperature at which at least a portion of the γ' via solid state transformation reverts to γ-phase, with subsequent cooling — either rapidly or slowly in a liquid or gaseous atmosphere — to a temperature below about 600° C. in order to further optimize the desired γ' and γ alloy morphology and further improve the mechanical properties of the alloy. In a presently preferred embodiment, an additional heat treatment is carried out by reheating or annealing the heat treated alloy at a temperature of from about 950° C. to 1,099° C. for a time period of one hour to 24 hours with subsequent cooling of the resulting annealed heat treated body to a temperature below about 600° C. In a still more preferred embodiment, another additional heat treatment is carried out at a temperature of from about 600° C. to 949° C. for a time period of about four hours to 72 hours with subsequent cooling of the resulting additionally annealed heat treated body to a temperature below 600° C. The steps of heat treating or annealing (sometimes referred to as stress relieving) of the alloys as described above can be carried out repetitively (either sequentially or nonsequentially) by heat treating and annealing γ/γ'-α alloys at various heating and cooling rates in order to optimize the desired type of γ' precipitate and accordingly thereby optimize the mechanical properties of the alloys.

In the practice of my invention including both heat treating and annealing of γ/γ'-α alloys surprisingly and beneficially the morphology of the molybdenum fibers does not change significantly — apparently due to the slight solubility of molybdenum fibers in the γ/γ' matrix — so that although the morphology of the γ/γ' matrix may change there is substantially no degradation of the molybdenum fibers.

The best mode of practicing my invention is more clearly understood from the following description taken in conjunction with the accompanying figures and table set out hereafter:

EXAMPLES I and II

Two γ/γ'-α eutectic alloys were studied in detail to examine the eutectic reaction and the subsequent γ' reprecipitation. The alloys are designated herein as AG8 and AG34. Their compositions are as follows:

| Alloy | Atom % | | | Weight % | | |
| Designation | Ni | Al | Mo | Ni | Al | Mo |
| --- | --- | --- | --- | --- | --- | --- |
| AG8 | 65.7 | 17.6 | 16.7 | 65.0 | 8.0 | 27.0 |

| Alloy | Atom % | | | Weight % | | |
|---|---|---|---|---|---|---|
| Designation | Ni | Al | Mo | Ni | Al | Mo |
| AG34 | 65.6 | 14.4 | 20.0 | 62.5 | 6.3 | 31.2 |

The two alloys were directionally solidified and fully aligned at 2 cm/hr in a unidirectional thermal gradient of 100° C./cm. The higher Al content alloy, AG8, yielded a structure as-directionally solidified consisting primarily of Mo fibers in an essentially pure $\gamma'$ matrix. The lower Al content, AG34, yielded a structure as-directionally solidified consisting primarily of Mo fibers surrounded by a $\gamma'$ matrix with $\gamma$ phase centered in the $\gamma'$ between Mo fibers and elongated in the growth direction.

Figure 2:
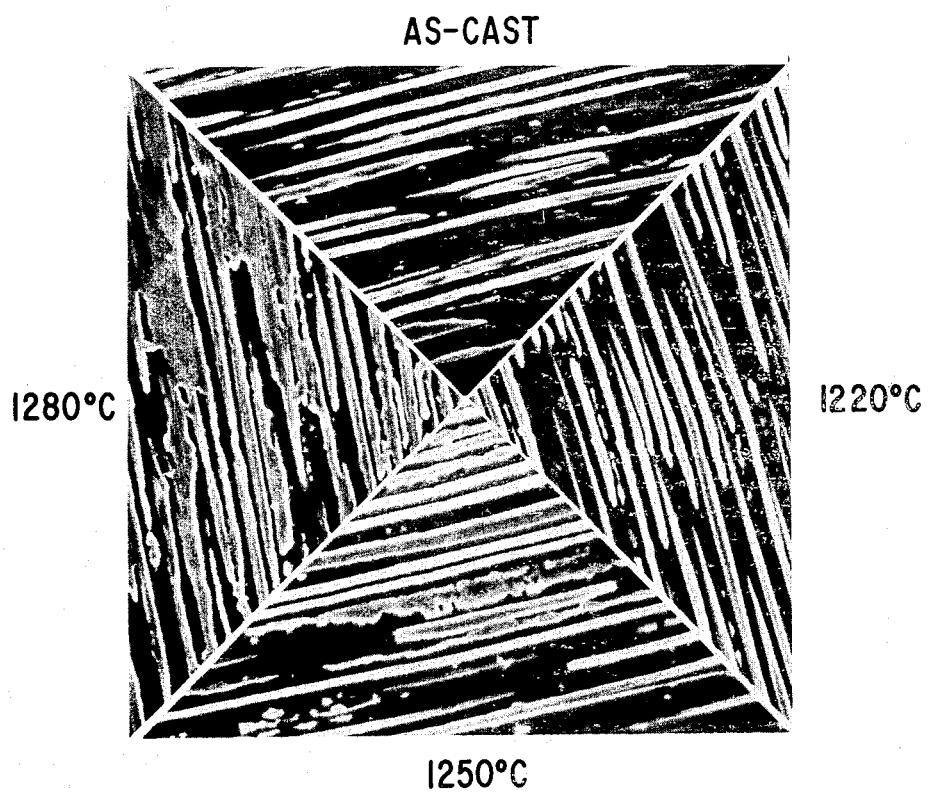

Heat treating experiments were conducted on the AG8 and AG34 alloys near their melting points. For each alloy annealing coupons were taken from the same directionally solidified ingot. Samples were held at their heat treating temperatures for one hour and then water quenched. Photomicrographs (1000x) of the resulting microstructures are shown in FIG. 1 for AG34. The Mo fibers are the long, aligned bright phase. The light phase in the matrix is $\gamma$ and the darker matrix phase is $\gamma'$. As the temperature of AG34 alloy was raised to near the alloy melting point, the $\gamma'$ precipitate phase dissolved into the parent $\gamma$ phase. The volume percent in the matrix was approximately the same as-cast and at 1050° C. At 1,230° C. the $\gamma'$ precipitate was significantly dissolved and at 1,260° C. the matrix was almost all back to the parent $\gamma$ phase. The same $\gamma'$ to $\gamma$ transition also took place in the AG8 alloy, containing 8 w/o Al, where the as-cast structure is essentially a pure $\gamma'$ matrix — as a result of the slow cooling associated with the AG8 alloy directional solidification process. Photomicrographs (1,000x) of the microstructures for AG8 alloys is shown in FIG. 2. The $\gamma'$ to $\gamma$ transition is the same as for the AG34 alloys containing 6.3 w/o Al. There is progressive dissolution of the $\gamma'$ into the parent $\gamma$ phase as the heat treatment temperature is raised from 1,220° to 1,280° C.

Figure 3:
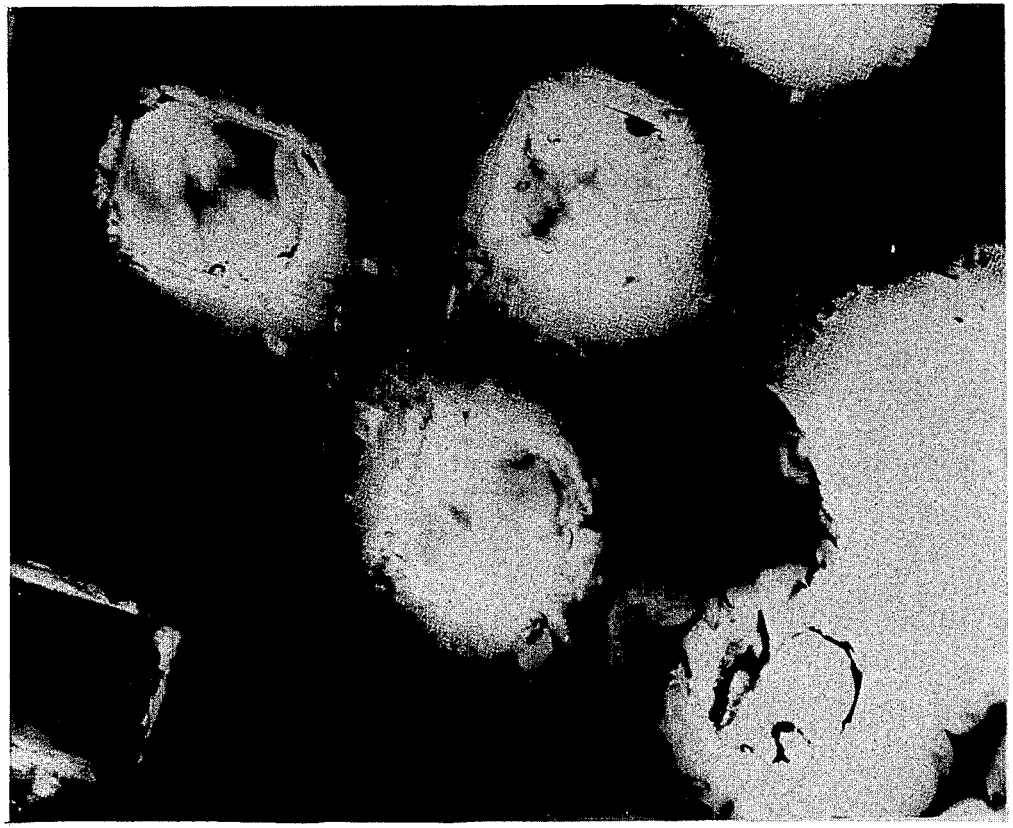

Further examination of the heat treated bodies by high magnification Transmission Electron Microscopy (TEM) revealed that the regions appearing as $\gamma$ phase in the low magnification light microscope pictures of FIGS. 1 and 2 after heat treatment are actually regions of $\gamma$ with a substantially uniform distribution of fine, reprecipitated $\gamma'$ phase particles. FIG. 3 is a high magnification TEM photomicrograph of a transverse section of a heated treated specimen of a directionally solidified $\gamma/\gamma'$-$\alpha$ nickel-base superalloy eutectic of the composition of FIG. 1, i.e. AG34. The light, large-grain essentially square areas are molybdenum fibers. The large dark essentially clear area represents a portion of the $\gamma'$ as directionally solidified that did not transform to $\gamma$ during the high temperature portion of the heat treatment. The area of speckled appearance is a region that was $\gamma$ at high temperature and after rapid cooling is now a region of small grain randomly reasonably uniformly distributed reprecipitated $\gamma'$ phase in a $\gamma$ matrix. The fine grain reprecipitated $\gamma'$ is believed to be the characteristic associated with heat treatment of the alloys of the invention which provides enhanced mechanical properties as evidenced by improved high temperature stress rupture life properties of the alloys after heat treatment with subsequent rapid cooling of the alloys via quenching. The property improvement from heat treatment thus results from transforming bulk $\gamma'$ to bulk $\gamma$ on high temperature exposure and then cooling to get fine $\gamma'$ precipitation in the $\gamma$. Therefore, the behavior is generic to all $\gamma/\gamma'$-$\alpha$ alloys.

EXAMPLES III–XIV

A series of $\gamma/\gamma'$-$\alpha$ eutectic alloys, within the scope of this invention and the copending above-referenced application, were directionally solidified and evaluated for elevated temperature stress rupture resistance in both the as-directionally-solidified and heat treated conditions. A summary of the data obtained is set out in Table I hereafter which illustrates the example number, the directional solidification (DS) rate, the alloy composition, the stress rupture condition (temperature/stress) tested, the rupture life of the as-directionally solidified specimen, the rupture life of the heat treated specimen, and the heat treatment conditions for the heat treated specimen. All alloys show significant improvement at test temperatures of 750° and 850° C. and in particular alloys of more than three chemical elements also show significant improvements at a test temperature of 1,100° C.

TABLE I

| Example No. | DS Rate (cm/hr) | Alloy Compositions by Weight Percents | | | | | | | Stress Rupture Conditions | | Rupture Life | | Heat Treatment | | |
|---|---|---|---|---|---|---|---|---|---|---|---|---|---|---|---|
| | | Ni | Al | Mo | Ta | Re | Ti | V | Temp. (° C) | Stress (MPa) | As-DS$^{(hr)}$ | H.T.* | (° C.) | (hr) | Quench+ |
| III | 2 | 62.5 | 6.3 | 31.2 | — | — | — | — | 750 | 725 | 150 | 1415 | 1245 | 1 | WQ |
| IV | 2 | " | " | " | " | " | " | " | 1100 | 120 | 108 | 141 | " | " | " |
| V | 2 | 62.0 | 5.7 | 32.3 | " | " | " | " | 750 | 800 | 135 | 1121 | " | " | " |
| VI | 2 | " | " | " | " | " | " | " | 1100 | 110 | 141 | 131 | " | " | " |
| VII | 2 | 60.3 | 5.2 | 32.9 | " | " | " | 1.6 | 850 | 625 | 10 | 230 | " | " | " |
| VIII | 2 | " | " | " | " | " | " | " | 1100 | 120 | 99 | 277 | " | " | " |
| IX | 2 | 62.5 | 6.3 | 31.2 | " | " | " | — | 850 | 485 | 24 | 148 | 1200 | " | " |
| X | 2 | " | " | " | " | " | " | " | " | " | " | 285 | 1240 | " | " |
| XI | 2 | " | " | " | " | " | " | " | " | " | " | 369 | 1270 | " | " |
| XII | 1 | 61.3 | 6.1 | 28.2 | 1.5 | 0.9 | 0.4 | 1.6 | " | " | 7 | 76 | 1250 | " | HQ |
| XIII | 2 | 60.6 | 5.2 | 30.9 | — | — | — | 3.3 | " | " | 49 | 352 | " | " | " |
| XIV | " | " | " | " | " | " | " | " | 1100 | 120 | 150 | 268 | " | " | " |

*H.T. = Heat Treated
+WQ = Water Quenched
HQ = Helium Quenched

As illustrated by the experimental data set out in Table I, heat treatment of $\gamma/\gamma'$-$\alpha$ eutectic molybdenum nickel-base superalloys has significantly improved stress-rupture properties when heat treated in accordance with the method described in the appended claims.

I claim:

1. A method of improving the mechanical properties of a γ/γ'-α eutectic nickel-base superalloy body containing a γ-phase, a γ'-phase, and an aligned molybdenum fiber α-phase which comprises the steps:
   (a) heating said body to a temperature at which at least a portion of the γ'-phase will transform to a γ-phase,
   (b) maintaining the heated body at said temperature to allow transformation of at least a portion of said γ'-phase to a γ-phase, and
   (c) cooling the transformed body to a temperature at which at least a portion of the γ-phase precipitates as a modified γ'-phase.

2. The claim 1 method, further comprising a directionally solidified multivariant eutectic nickel-base superalloy body.

3. The claim 2 method, wherein step (a) said temperature is from 1,100° C. to 1,300° C., wherein step (b) said temperature is maintained for at least one second, and wherein step (c) said temperature is less than 1,100° C.

4. The claim 3 method, wherein step (a) said temperature is from 1,200° C. to 1,290° C., wherein step (b) said time interval was from 5 minutes to 2 hours, wherein step (c) temperature is less than 600° C.

5. The claim 4 method, wherein steps (a), (b), and (c) are carried out in an inert atmosphere.

6. The claim 5 method, further comprising the additional steps:
   (d) reheating the transformed body of step (c) to a temperature of 600° C. to 1,099° C.,
   (e) maintaining the reheated body at the reheat temperature for one hour to 72 hours, and
   (f) cooling the reheated body to a temperature below 600° C.

7. The claim 6 method, wherein step (f) is carried in air.

8. The claim 1 method, wherein steps (a), (b), and (c) are repeated.

9. The claim 7 method, wherein steps (d), (e), and (f) are repeated.

10. The claim 7 method, wherein steps (a), (b), and (c) and/or steps (d), (e), and (f) are repeated.

11. The claim 1 method, wherein said body contains on a weight percent basis, 2–12 Al, 12–40 Mo, and optionally 0–15 Co, 0–6 Ti, 0–8 V, 0–12 Cr, 0–15 Ta, 0–10 W, 0–8 Re, 0–12 Nb, 0–2 Zr, 0–2 Hf, 0–1 Y and the rare earth elements, 0.0–0.2 B or 0.0–0.2 C, the balance being Ni.

12. The claim 1 method, wherein said body contains on a weight percent basis, 7.0–8.5 Al, 25.0–28.0 Mo, 0.0–10.0 Cr, 0.0–10.0 Ta, 0.0–10.0 W, 0.0–8.0 Re, the balance being Ni.

13. The claim 1 method, wherein said body contains on a weight percent basis, 2.0–6.9 Al, 12.0–40.0 Mo, 0.0–12.0 Cr, 0.0–15.0 Co, 0.0–15.0 Ta, 0.0–6.0 Ti, 0.0–8.0 V, 0.0–10.0 W, 0.0–8.0 Re, 0.0–12.0 Nb, 0.0–2.0 Zr, 0.0–2.0 Hf, 0.0–1.0 Y and the rare earth elements, 0.0–0.2 B, 0.0–0.2 C, and the balance being Ni.

14. The claim 1 method, wherein said body contains on a weight percent basis, 2.0–6.0 Al, 12.0–40 Mo, 0.0–12.0 Cr, 0.0–15.0 Ta, 0.0–10.0 W, 0.0–8.0 Re, 0.0–12.0 Nb, 0.0–2.0 Zr, 0.0–2.0 Hf, 0.0–1.0 Y, and the rare earth elements, 0.0–0.2 B, 0.0–0.2 C, and the balance being Ni.

15. The claim 1 method, wherein said body contains on a weight percent basis, 4.2–6.5 Al, 12.0–40.0 Mo, 0.0–12.0 Cr, 0.0–15.0 Co, 0.0–15.0 Ta, 0.0–6.0 Ti, 0.0–8.0 V, 0.0–10.0 W, 0.0–8.0 Re, 0.0–12.0 Nb, 0.0–2.0 Zr, 0.0–2.0 Hf, 0.0–1.0 Y and the rare earth elements, 0.0–0.2 B, 0.0–0.2 C, and the balance being Ni.

* * * * *